US010054622B2

(12) United States Patent
Hernandez et al.

(10) Patent No.: US 10,054,622 B2
(45) Date of Patent: Aug. 21, 2018

(54) METHOD AND APPARATUS FOR LRA REAL TIME IMPEDANCE TRACKING AND BEMF EXTRACTION

(71) Applicant: Texas Instruments Incorporated, Dallas, TX (US)

(72) Inventors: David Hernandez, Dallas, TX (US); Mandy Barsilai, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 693 days.

(21) Appl. No.: 14/601,785

(22) Filed: Jan. 21, 2015

(65) Prior Publication Data

US 2015/0204925 A1    Jul. 23, 2015

Related U.S. Application Data

(60) Provisional application No. 62/010,274, filed on Jun. 10, 2014, provisional application No. 61/929,672, filed on Jan. 21, 2014.

(51) Int. Cl.
| G01R 27/02 | (2006.01) |
| G01R 31/28 | (2006.01) |
| G01R 31/34 | (2006.01) |

(52) U.S. Cl.
CPC ......... G01R 27/02 (2013.01); G01R 31/2829 (2013.01); *G01R 31/343* (2013.01)

(58) Field of Classification Search
USPC .......................................................... 702/65
See application file for complete search history.

(56) References Cited

U.S. PATENT DOCUMENTS

| 6,411,052 B1 * | 6/2002 | Mir .......................... H02P 6/10 |
| | | 318/434 |
| 2012/0229264 A1 * | 9/2012 | Bosch ..................... G06F 3/016 |
| | | 340/407.1 |
| 2014/0118126 A1 * | 5/2014 | Garg ....................... G06F 3/016 |
| | | 340/407.1 |

* cited by examiner

*Primary Examiner* — Paul D Lee

(74) *Attorney, Agent, or Firm* — Michelle F. Murray; Charles A. Brill; Frank D. Cimino

(57) ABSTRACT

A method, apparatus and a system for a Linear Resonant Actuator (LRA) real time impedance tracking. The method includes extracting the Back Electro-Motive Force (BEMF) voltage from a driver's load current by determining a current multiplying factor utilizing a Least Mean Square (LMS) algorithm and introducing an error function to control the gain of the load current and isolate the BEMF.

19 Claims, 7 Drawing Sheets

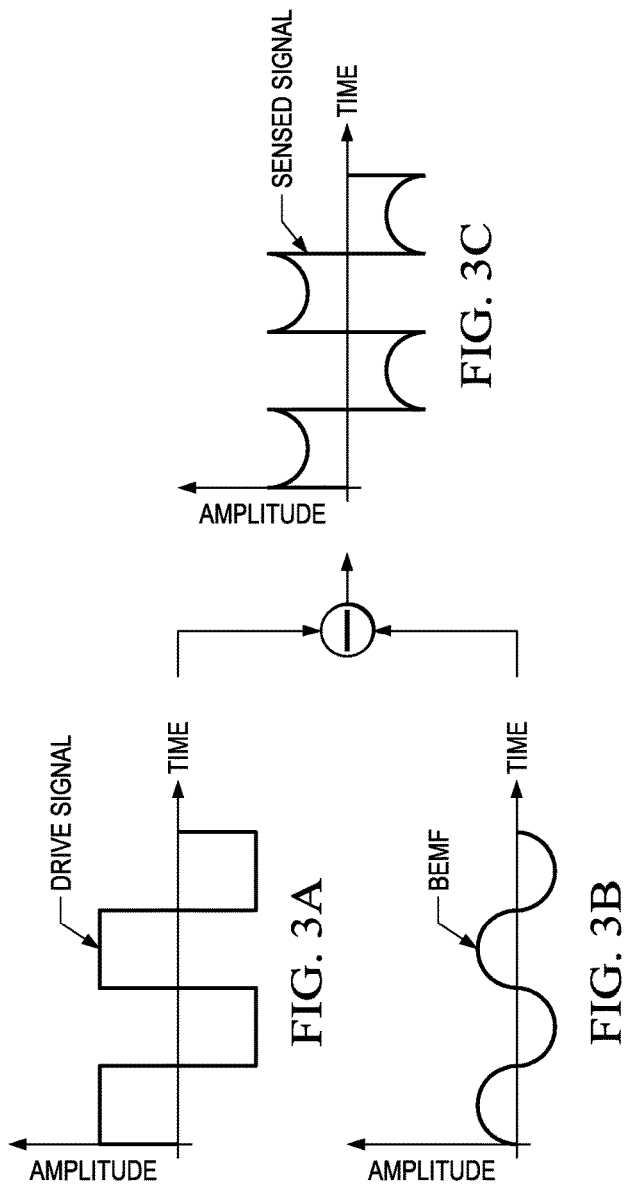
FIG. 3A
FIG. 3B
FIG. 3C
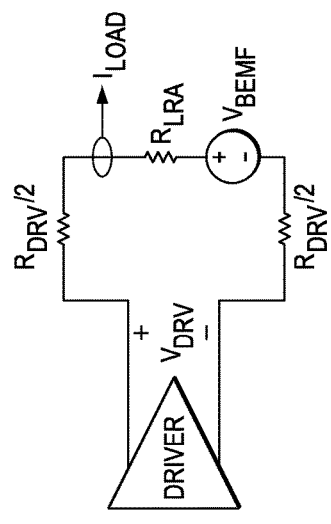
FIG. 4

METHOD AND APPARATUS FOR LRA REAL TIME IMPEDANCE TRACKING AND BEMF EXTRACTION

CROSS REFERENCES TO RELATED APPLICATIONS

This application claims priority from U.S. Provisional Patent Application No. 61/929,672 filed Jan. 21, 2014, and U.S. Provisional Patent Application No. 62/010,274, filed Jun. 10, 2014, both of which are hereby incorporated by reference in their entirety.

BACKGROUND OF THE INVENTION

Field of the Invention

Embodiments of the present invention generally relate to a method and apparatus for LRA real time impedance tracking and BEMF extraction Description of the Related Art Linear Resonant Actuators (LRA) are very similar to mass loaded spring systems. LRA actuators can be modeled as Series RL with a BEMF voltage element, which is calculated based on mechanical properties of the LRA. For optimum efficiency, they are driven at the resonance frequency.

Estimating LRA actuator health, aging and failures before they occur can have substantial benefits for actuator manufacturers and end product manufacturers. Such estimation reduces failures on the field and facilitates the problem diagnostic process. LRA real-time impedance tracking algorithm can enable technologies such as actuator health monitoring, aging estimation, actuator temperature estimation, and the likes.

For LRA drivers, the BEMF voltage is sensed directly going to a high-impedance mode. In such architectures, BEMF sampling requires a halt in driving the signal, which lowers the efficiency/headroom at which the driver can work resulting in less acceleration. FIG. 1 is an embodiment of a sinusoidal BEMF wave superimposed on a driver output as implemented in the prior art. As shown in FIG. 1, the current architecture does not produce a square wave, since it cannot continuously drive the LRA.

The BEMF can also be extracted by measuring the load current if the LRA's impedance is known. Therefore, there is a need for a method and/or apparatus for LRA real time impedance tracking and BEMF extraction.

SUMMARY OF THE INVENTION

Embodiments of the present invention relate to a method, apparatus and a system for Linear Resonant Actuator (LRA) real time impedance tracking and BEMF extraction. The method includes extracting the Back Electro-Motive Force (BEMF) voltage from a driver's load current by determining a current multiplying factor utilizing an adaptive algorithm and introducing an error function for the adaptive algorithm to control the gain of the load current and isolate the BEMF.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-C are embodiments of signals produced and utilized in the Linear Resonant Actuators (LRA) system;

FIG. 4 is an embodiment of a circuit from which the Back Electro-Motive Force (BEMF) voltage is extracted by measuring the load current;

DETAILED DESCRIPTION

Proposed herein are a method, apparatus and system for Linear Resonant Actuators (LRA) real time impedance tracking that extract the Back Electro-Motive Force (BEMF) voltage from the load current, which cancels the current due to the driving signal and isolates the BEMF.

Figure 1:
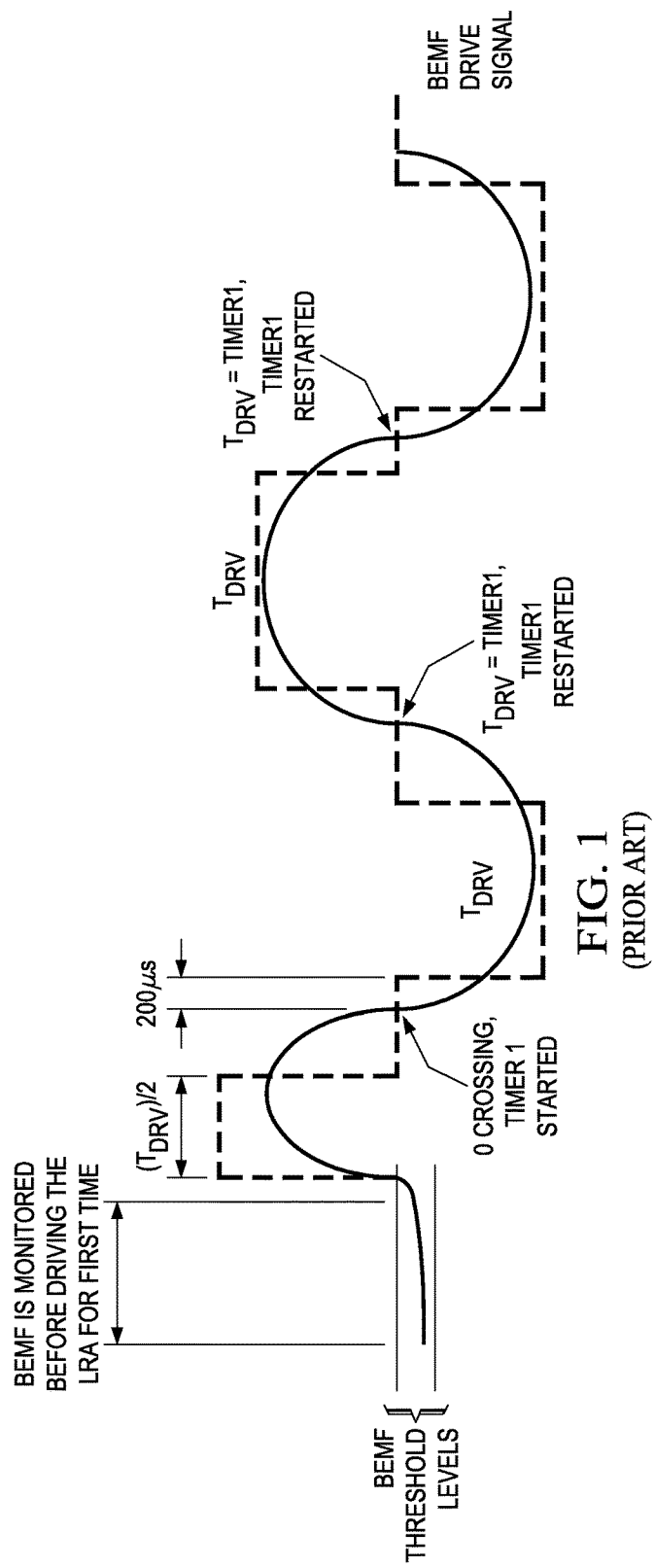
FIG. 1 is an embodiment of a sinusoidal BEMF wave superimposed on a driver output as implemented in the prior art.
Figure 2:
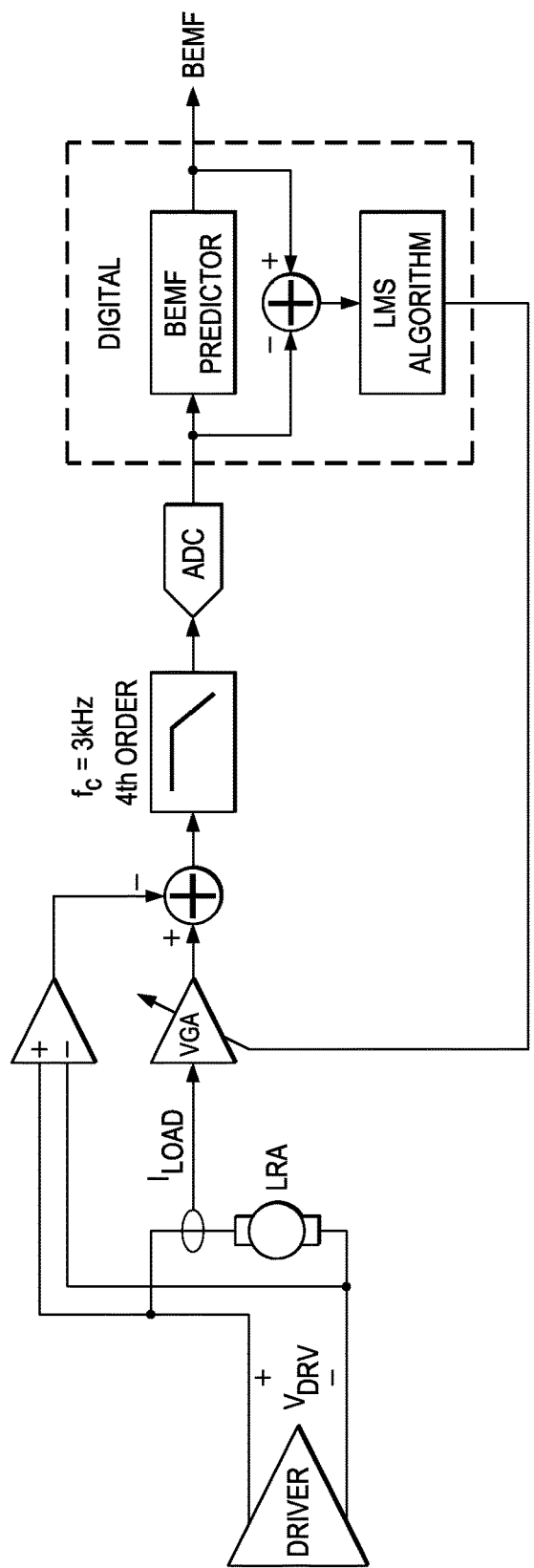
FIG. 2 is an embodiment of a Linear Resonant Actuators (LRA) system with simultaneous BEMF extraction and driving.

FIG. 2 is an embodiment of a Linear Resonant Actuators (LRA) system with simultaneous BEMF extraction and driving. As shown in FIG. 2, a driver connects to the sense amplifier and the LRA. Both the sense amplifier and the LRA process the driver voltage, $V_{DRV}$. The load current of the LRA, $I_{Load}$ is inputted into a signal multiplier, here shown to be a VGA, connected to the LRA. The output of the VGA is an amplified current, that when combined with the drive output signal produces a raw BEMF extraction. This signal is then filtered and converted to a digital equivalent using an ND converter.

The output of the ND converter is inputted into a module to produce the BEMF signal, for example the digital module shown in FIG. 2. The digital module of FIG. 2 includes a BEMF predictor and an adaptive algorithm module, such as LMS algorithm module. The BEMF predictor utilizes the filtered, digital sensed signal to output the BEMF. In addition, the output of the VGA and the output BEMF of the BEMF predictor are utilized by the LMS algorithm to generate an error signal for the LMS algorithm module. This error function is the metric needed for finding the cancellation gain and controlling, thus, the gain of the amplifier. Thus, the output of the LMS algorithm is used by the VGA.

FIGS. 3A-C are embodiments of signals produced and/or utilized in the LRA real time impedance tracking system. FIG. 3A denotes the current due to the driver signal itself. FIG. 3B denotes the current due to the actuator's BEMF. FIG. 3C denotes the total load current, which is composed of the components in FIGS. 3A and 3B.

FIG. 4 is an embodiment of a circuit from which the BEMF voltage is extracted. As shown in FIG. 4, the BEMF voltage can be extracted from the sensed load current as:

$$V_{BEMF} = V_{DRV} - (R_{DRV} + R_{LRA})I_{LOAD}$$

where $R_{DRV}$ is the driver's output resistance and $R_{LRA}$ is the actuator's resistance.

If $R_{DRV} \ll R_{LRA}$, then $$V_{BEMF} = V_{DRV} - \text{Gain} \cdot I_{LOAD}$$

$$\text{Gain} = R_{LRA}$$

As a result, finding the cancellation Gain is equivalent to finding the actuator's resistance. In some embodiments, the gain might be a scaled version, usually by a known factor, of $R_{LRA}$ due to dynamic range optimization.

A predictor function is used, for example a second-order system. In one embodiment, the optimum cancellation Gain is obtained by comparing the output of the BEMF predictor with the second order predictor; wherein the second order predictor is $$P[n] = 1.9879P[n-1] - 0.9885P[n-2]$$

Whereas, the LMS algorithm utilizes $$\text{Error}[n] = y[n] - P[n]$$

$$\text{Gain}[n+1] = \text{Gain}[n] + \mu \times \text{sgn}(V_{Drive})\text{Error}[n]$$

Figure 5:
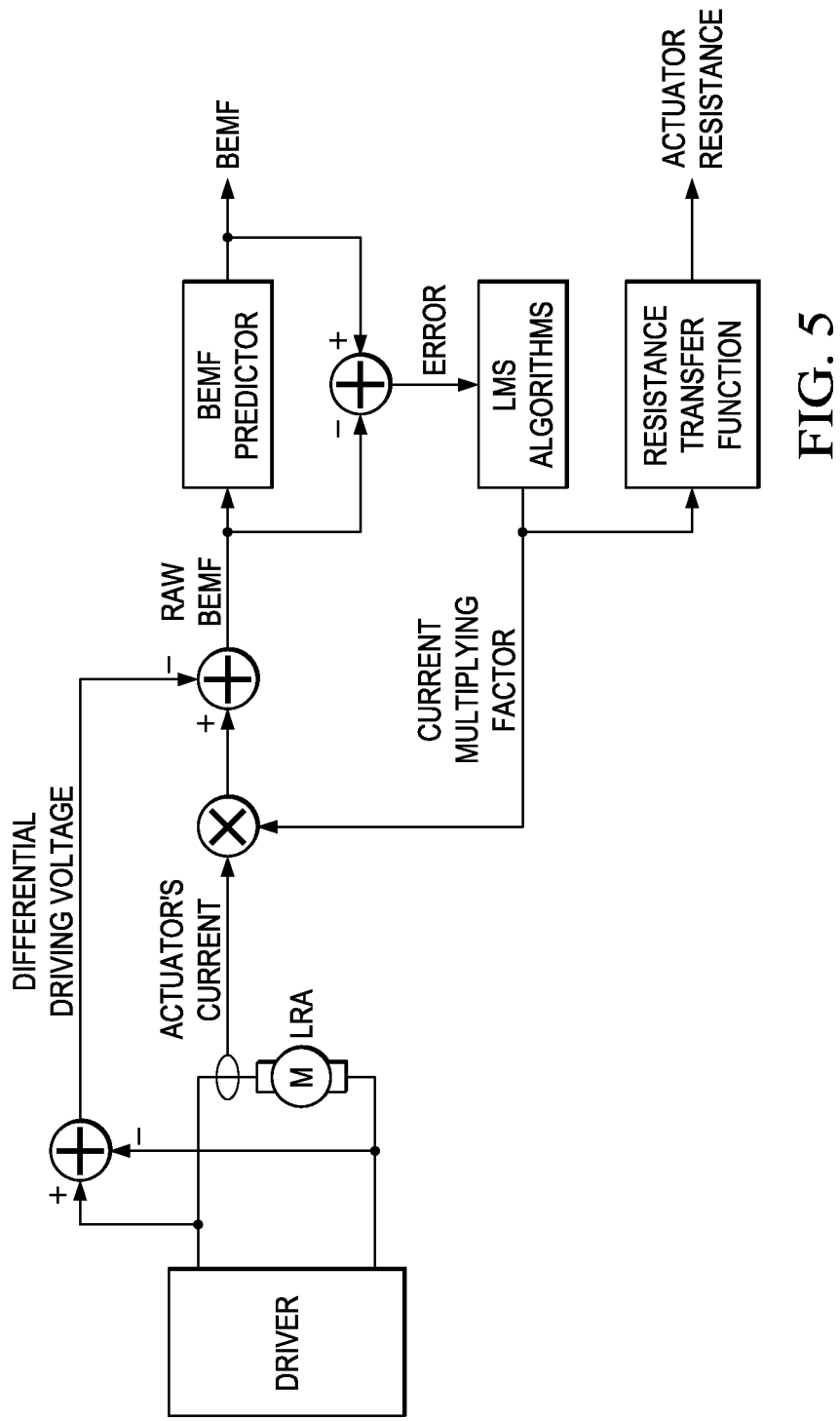
FIG. 5 is an embodiment of a Linear Resonant Actuators (LRA) system with real time impedance tracking and BEMF extraction.

FIG. 5 is an embodiment of a Linear Resonant Actuators (LRA) system with real time impedance tracking and BEMF extraction. As shown in FIG. 5, the differential driving voltage and the actuator's current corrected by the current multiplying factor of the LMS algorithms are combined to produce a raw BEMF. The output is a raw BEMF signal. The raw BEMF is utilized by the BEMF predictor to produce the BEMF signal. The LMS algorithm utilizes the raw BEMF and the BEMF to output the current multiplying factor utilized by the VGA to correct the actuator's current. In one embodiment, a Resistance Transfer Function utilizes the current multiplying factor to produce the actuator resistance.

Figure 6:
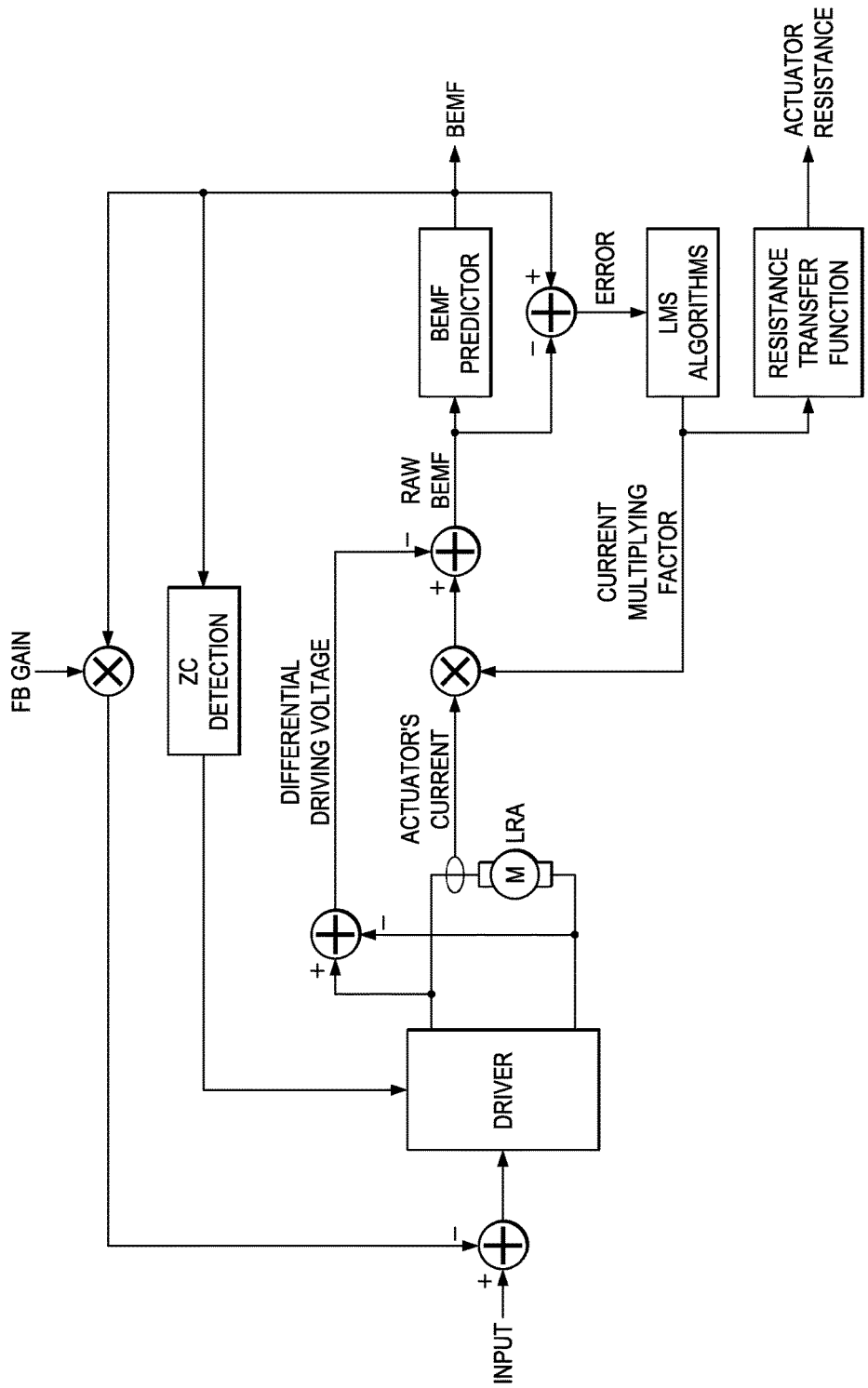
FIG. 6 is an embodiment of a Linear Resonant Actuators (LRA) system with real time impedance tracking, BEMF extraction, auto-resonance tracking, and closed-loop BEMF control.
Figure 7:
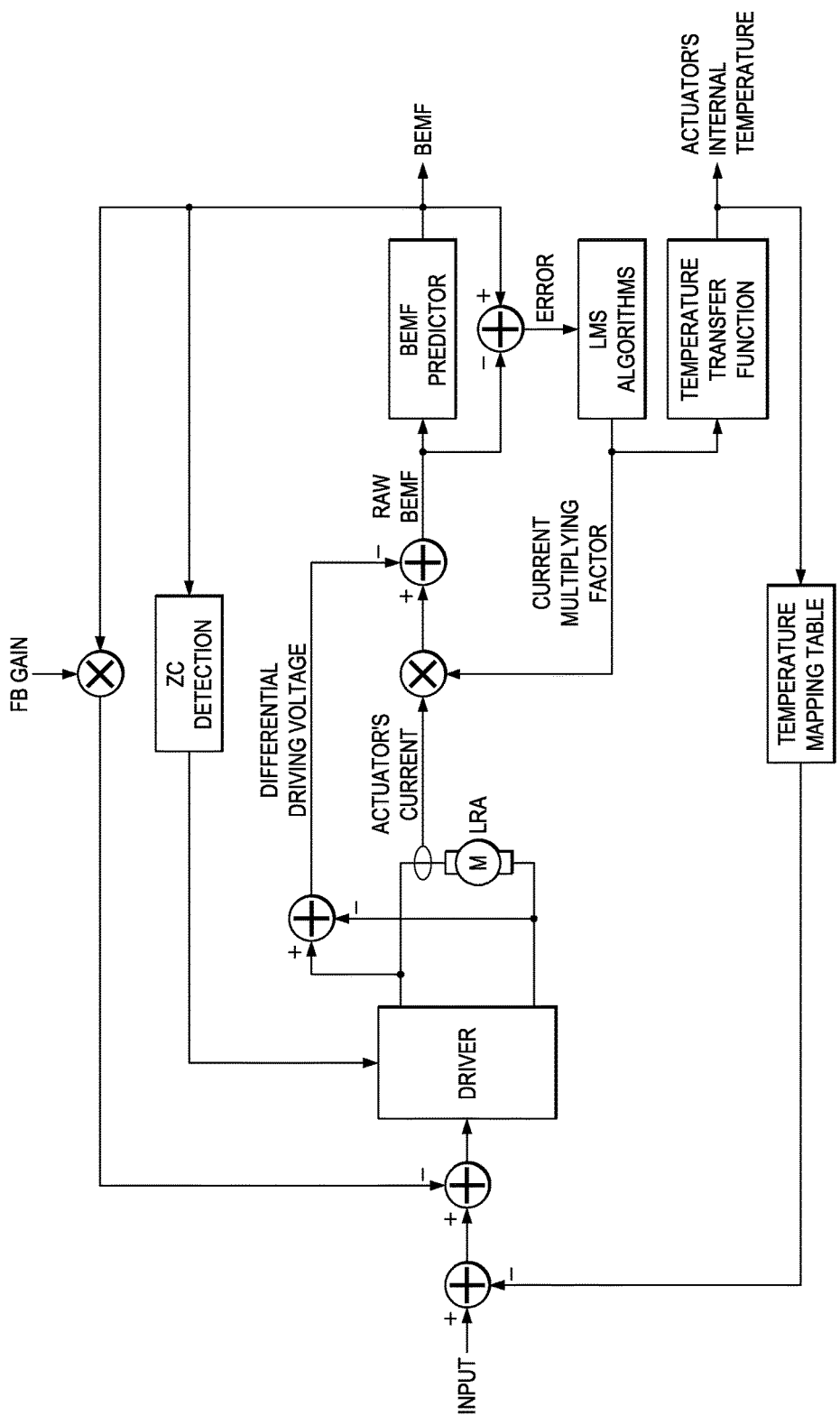
FIG. 7 is another embodiment of a Linear Resonant Actuators (LRA) system that includes temperature monitoring and control.
Figure 8:
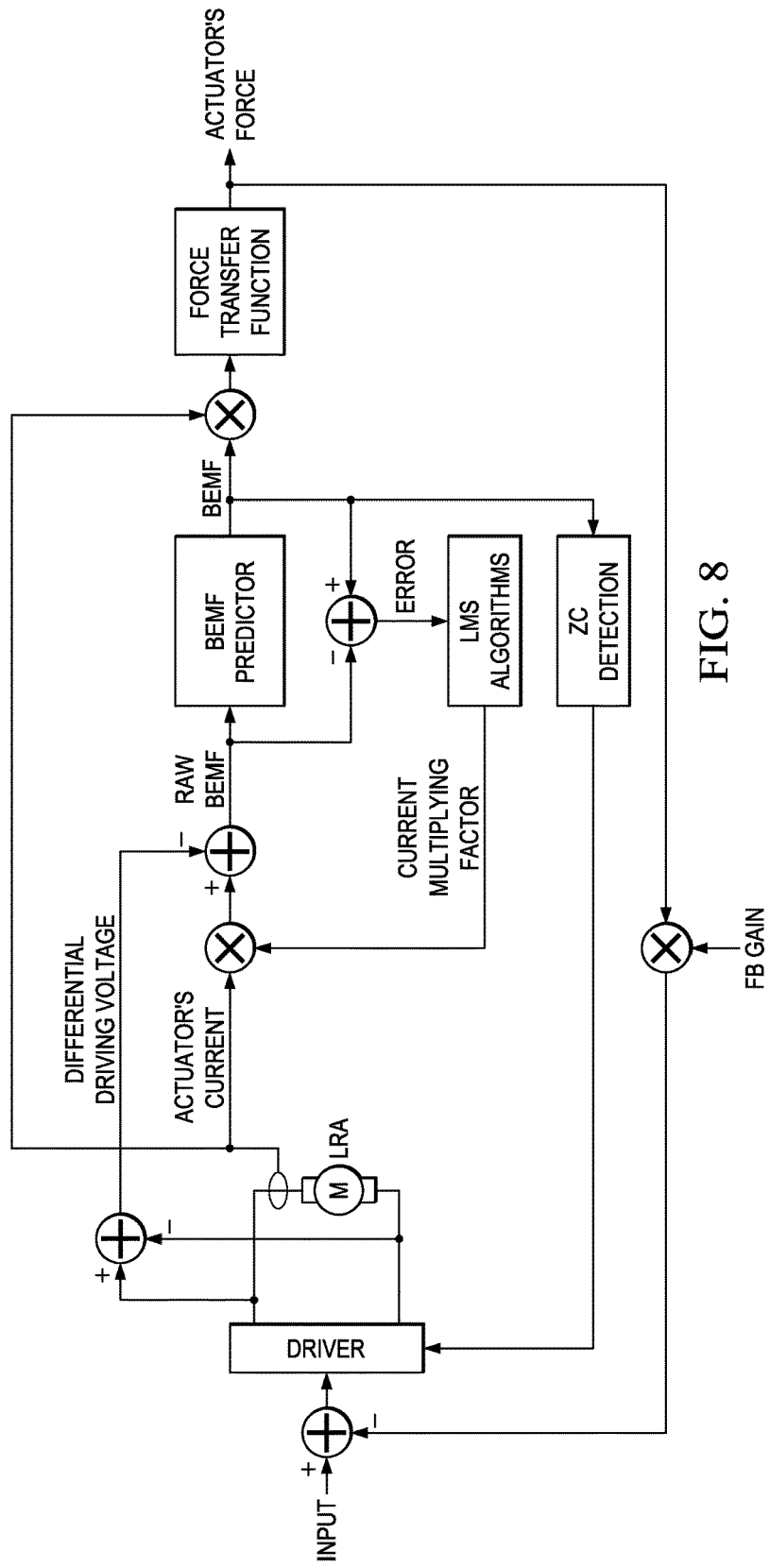
FIG. 8 is yet another embodiment of a Linear Resonant Actuators (LRA) system that includes an actuator force feedback.

LRA real time impedance tracking may be utilized for many applications and systems. Examples of such applications and systems are outlined in FIG. 6-8. FIG. 6 is an embodiment of an LRA real time impedance tracking system. In FIG. 6, the LRA real time impedance tracking is used in a zero-cross detection system for auto-resonance tracking. It can also include a closed-loop BEMF controller. FIG. 7 is another embodiment of an LRA real time impedance tracking system. In FIG. 7, the LRA real time impedance tracking is used in a temperature transfer system to determine and control an actuator's internal temperature. FIG. 8 is yet another embodiment of an LRA real time impedance tracking system. In FIG. 8, the LRA real time impedance tracking is used in a force transfer system to determine an actuator's force.

Thus, in one embodiment, LRA real time impedance tracking is used in an actuator's thermal monitoring and control loop that uses the impedance tracking information to estimate the temperature of the actuator and use it as a feedback signal for a closed loop system to limit the maximum temperature that the actuator experiences. The LRA real time impedance tracking may also be used for over-excursion protection. In such an embodiment, real time impedance information and the BEMF signal are used to detect discontinuities associated with the LRA mass hitting the case. As such, such information is useful in a control loop mechanism for driving the actuator harder without inflicting damage. In another embodiment, the LRA real time impedance tracking is used for aging estimation and predictive failure detection. In such an embodiment, the impedance tracking information is used to estimate actuator's aging for predicting actuator failures and remaining useful lifetime.

Thus, the advantages of LRA real time impedance tracking system are at least the following:
1. Sense and drive linear resonant actuator's simultaneously with automatic resonance monitoring and tracking
2. High-impedance is not needed for reducing the limitations present with high-voltage/high-frequency/high-inductance actuator's, where there is not enough time to dissipate the current through the inductance
3. Increase energy delivered to the load as it does not need to stop driving to sense the feedback signal
4. BEMF is available to the controller at all times, instead of just in certain windows, which allows for the possibility of further filtering and digital signal processing to improve controller's performance, such as, compensation and noise suppression
5. Simultaneous access to BEMF signal and current consumption allows for mechanical power control loop to improve consistency, even if the mass attached changes, and will help limit excursion of LRA to improve reliability
6. Track the actuator's impedance in real time, which has many potential applications related to reliability and control, such as over-temperature and over-excursion protection.

It should be noted that such a solution may be implemented with different analog/digital partitions. For example, one embodiment can use a current/voltage sense analog front-end, and then have both signals converted to the digital domain to complete the processing.

While the foregoing is directed to embodiments of the present invention, other and further embodiments of the invention may be devised without departing from the basic scope thereof, and the scope thereof is determined by the claims that follow.

What is claimed is:

1. A method of generating an output Back Electro-Motive Force (BEMF) by a linear resonant actuator (LRA) from a load current that is generated based on a driver voltage produced by a driver circuit, the method comprising:
   generating, by a BEMF predictor, an output BEMF, based on a raw BEMF;
   determining, by an adaptive algorithm module, an error function, based on the raw BEMF and based on the output BEMF; and
   producing, by a signal multiplier, a sensed signal, based on the load current and based on the error function.

2. The method of claim 1, wherein the adaptive algorithm is at least one of a Least Mean Square (LMS) algorithm, a Recursive Least Squares (RLS) algorithm, or a Kalman algorithm.

3. The method of claim 2, wherein the LMS algorithm comprises:

$$\text{Error}[n] = y[n] - P[n]; \text{ and}$$

$$\text{Gain}[n+1] = \text{Gain}[n] + \mu \times \text{sgn}(V_{Drive})\text{Error}[n],$$

wherein n is an integer, y[n] is an output of the output BEMF, P[n] is a second order predictor, $\mu$ is a constant, and $V_{drive}$ is the driver voltage.

4. The method of claim 1, wherein at least a portion of the method is performed by a Current/Voltage Sense analog front end.

5. The method of claim 1, further comprising:
   producing, by a driver, the driver voltage;
   generating, by a Linear Resonant Actuator (LRA), a load current based on the driver voltage; and converting, by an analog to digital converter, the sensed signal, to generate the raw BEMF.

6. The method of claim 5, further comprising:
reading, by a sense amplifier, the driver voltage, to produce a sensed voltage;
combining, by a combiner, the sensed signal and the sensed voltage, to produce a raw BEMF extraction; and
wherein converting the sensed signal to the raw BEMF comprises producing the raw BEMF based on the raw BEMF extraction.

7. The method of claim 6, further comprising:
filtering, by a filter, the raw BEMF extraction, to produce an analog BEMF; and
wherein converting the sensed signal to the raw BEMF comprises producing the raw BEMF based on the analog BEMF.

8. The method of claim 1, wherein the signal multiplier is a variable gain amplifier (VGA).

9. An apparatus for generating an output Back Electro-Motive Force (BEMF) by a linear resonant actuator (LRA) from a load current that is generated based on a driver voltage produced by a driver circuit, the apparatus comprising:
a circuit, coupled to the LRA, arranged to generate a raw BEMF based on an analog signal of the load current;
a BEMF predictor, coupled to the circuit, arranged to produce an output BEMF based on the raw BEMF; and
a Least Mean Square (LMS) algorithm module, coupled to the BEMF predictor, arranged to utilize the raw BEMF to produce a current multiplying factor.

10. The apparatus of claim 9, wherein the circuit further comprises:
the driver, coupled to the LRA, arranged to produce the driver voltage;
the LRA coupled to the driver, wherein the LRA is configured to utilize the driver voltage to generate a load current;
a signal multiplier, coupled to the LRA, arranged to utilize the load current and the current multiplying factor to produce a sensed signal; and
an analog to digital converter, coupled to the BEMF predictor, arranged to produce the raw BEMF in accordance with the sensed signal.

11. The apparatus of claim 10, further comprising:
a sense amplifier, coupled to the driver, arranged to read the driver voltage, to generate a sensed voltage;
a combiner, coupled to the sense amplifier and to the signal multiplier, arranged to combine the sensed signal and the sensed voltage, to generate a raw BEMF extraction; and
wherein the analog to digital converter is arranged to produce the raw BEMF based on the raw BEMF extraction.

12. The apparatus of claim 11, further comprising a filter, coupled to the combiner, arranged to filter the raw BEMF extraction, to generate an analog BEMF, wherein the analog to digital converter is arranged to produce the raw BEMF based on the analog BEMF.

13. The apparatus of claim 9, wherein the circuit further comprises at least one of a resistance transfer function, a temperature transfer function, or a force detection.

14. The apparatus of claim 10, wherein the signal multiplier is a variable gain amplifier (VGA).

15. The apparatus of claim 10, further comprising a Current/Voltage Sense analog front-end.

16. The apparatus of claim 9, wherein the LMS algorithm module is further arranged to generate the raw BEMF based on the output BEMF.

17. The apparatus of claim 9, further comprising a resistance transfer function module, coupled to the LMS algorithm module, arranged to generate an actuator resistance based on the current multiplying factor.

18. A method of generating an output Back Electro-Motive Force (BEMF) by a linear resonant actuator (LRA) from a load current that is generated based on a driver voltage produced by a driver curcuit, the method comprising:
generating, by the driver circuit, a raw Back Electro-Motive Force (BEMF) based on an analog signal of the load current;
producing, by a BEMF predictor, an output BEMF based on the raw BEMF; and
utilizing, by a Least Mean Square (LMS) algorithm module, the raw BEMF, to produce a current multiplying factor.

19. The method of claim 18, further comprising:
producing, by a driver of the driver circuit, the driver voltage;
utilizing, by the LRA of the driver circuit, the driver voltage, to generate the load current;
utilizing, by a signal multiplier of the driver circuit, the load current and the current multiplying factor, to produce a sensed signal; and
producing, by an analog to digital converter of the driver circuit, the raw BEMF in accordance with the sensed signal.

* * * * *